(12) United States Patent
Tsai et al.

(10) Patent No.: US 7,864,594 B2
(45) Date of Patent: Jan. 4, 2011

(54) MEMORY APPARATUS AND METHOD THEREOF FOR OPERATING MEMORY

(75) Inventors: Wen-Jer Tsai, Hsinchu (TW); Tien-Fan Ou, Hsinchu (TW); Jyun-Siang Huang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 113 days.

(21) Appl. No.: 12/250,766

(22) Filed: Oct. 14, 2008

(65) Prior Publication Data
US 2009/0116284 A1 May 7, 2009

Related U.S. Application Data

(60) Provisional application No. 60/985,966, filed on Nov. 6, 2007.

(51) Int. Cl.
G11C 11/34 (2006.01)
G11C 16/04 (2006.01)
(52) U.S. Cl. .............. 365/185.28; 365/72; 365/185.05; 365/185.18
(58) Field of Classification Search ............ 365/185.28, 365/185.05, 185.18
See application file for complete search history.

(56) References Cited

U.S. PATENT DOCUMENTS

| | | | | |
|---|---|---|---|---|
| 5,838,617 A * | 11/1998 | Bude et al. | ............. | 365/185.18 |
| 6,067,254 A * | 5/2000 | Kuo et al. | ............. | 365/185.28 |
| 6,707,078 B1 | 3/2004 | Shiraiwa et al. | | |
| 6,829,171 B2 | 12/2004 | Ooishi | | |
| 7,133,317 B2 | 11/2006 | Liao et al. | | |
| 7,136,306 B2 * | 11/2006 | Xue et al. | ............. | 365/185.28 |
| 7,190,614 B2 | 3/2007 | Wu | | |
| 7,277,324 B2 | 10/2007 | Tomita | | |
| 2005/0162925 A1 * | 7/2005 | Cho et al. | ............. | 365/185.28 |
| 2007/0247907 A1 * | 10/2007 | Chang et al. | .......... | 365/185.16 |
| 2009/0116287 A1 * | 5/2009 | Ou et al. | ................ | 365/185.13 |

FOREIGN PATENT DOCUMENTS

| | | |
|---|---|---|
| GB | 953344 | 3/1964 |
| JP | 48084043 | 11/1973 |
| JP | 03215647 | 9/1991 |
| JP | 04120235 | 4/1992 |
| JP | 2006117976 | 5/2006 |

(Continued)

OTHER PUBLICATIONS

Database WPI Week 197411, Thomson Scientific, London, GB; AN 1974-20253V.

(Continued)

*Primary Examiner*—Ly D Pham
(74) *Attorney, Agent, or Firm*—J.C. Patents

(57) ABSTRACT

A memory apparatus, a controller, and a method thereof for programming non-volatile memory cells are provided. The memory apparatus includes a plurality of memory cells, wherein each memory cell shares a source/drain region with a neighboring memory cell. The method utilizes a compensation electron flow applied into a source/drain region between two memory cells to provide enough electron flow to program one of the two memory cells, even under the circumstances that the other memory cell has a greater threshold voltage, such that the dispersion of the programming speed of the memory cells is reduced.

22 Claims, 16 Drawing Sheets

FOREIGN PATENT DOCUMENTS

| | | |
|---|---|---|
| JP | 2006213947 | 8/2006 |
| TW | I291766 | 12/2007 |
| TW | I292156 | 1/2008 |
| TW | I295803 | 4/2008 |
| TW | I295803 | 4/2008 |

OTHER PUBLICATIONS

Database WPI Week 200633, Thomson Scientific, London, GB; AN 2006-313800.

Database WPI Week 200655, Thomson Scientific, London, GB; AN 2006-534168.

Related International Patent Application Serial No. PCT/US09/60419, International Search Report and Written Opinion (mailed Jan. 27, 2010).

* cited by examiner

| | Programming Bit-LA | Programming Bit-RB |
|---|---|---|
| BL1 | 0V | 5V |
| BL2 | floating | floating |
| BL3 | 5V | 0V |
| BL4 | floating | floating |
| WL1 | 10V | 10V |
| DWL | 5V | 5V |
| BLT1 | 0V | 0V |
| BLT2 | 10V | 10V |
| BLT3 | 10V | 10V |
| BLT4 | 0V | 0V |
| BLB1 | 0V | 0V |
| BLB2 | 0V | 0V |
| BLB3 | 0V | 0V |
| BLB4 | 0V | 0V |
| Substrate | 0V or −Vb | 0V or −Vb |
| Un-selected Word Line | 0V or −Vg | 0V or −Vg |

FIG.10

| | Programming Bit-LA | Programming Bit-RB |
|---|---|---|
| BL1 | 0V | 5V |
| BL2 | floating | floating |
| BL3 | 5V | 0V |
| BL4 | floating | floating |
| WL | 10V | 10V |
| DWLU | 0V | 5V |
| DWLD | 5V | 0V |
| BLT1 | 0V | 0V |
| BLT2 | 10V | 10V |
| BLT3 | 10V | 10V |
| BLT4 | 0V | 0V |
| BLB1 | 0V | 0V |
| BLB2 | 0V | 0V |
| BLB3 | 0V | 0V |
| BLB4 | 0V | 0V |
| Substrate | 0V or −Vb | 0V or −Vb |
| Un-selected Word Line | 0V or −Vg | 0V or −Vg |

FIG.13

|  | Programming Bit-LA | Programming Bit-RB |
|---|---|---|
| BL1 | 0V | 5V |
| BL2 | floating | floating |
| BL3 | 5V | 0V |
| BL4 | floating | floating |
| WL | 10V | 10V |
| DWLU | 0V | 5V |
| DWLD | 5V | 0V |
| BLT1 | 0V | 0V |
| BLT2 | 10V | 10V |
| BLT3 | 10V | 10V |
| BLT4 | 0V | 0V |
| BLB1 | 0V | 0V |
| BLB2 | 0V | 0V |
| BLB3 | 0V | 0V |
| BLB4 | 0V | 0V |
| Substrate | 0V or −Vb | 0V or −Vb |
| Un-selected Word Line | 0V or −Vg | 0V or −Vg |

FIG.16

|  | Programming Bit-LA | Programming Bit-RB |
|---|---|---|
| BL1 | 0V | 5V |
| BL2 | floating | floating |
| BL3 | 5V | 0V |
| BL4 | 0V | 0V |
| WL | 10V | 10V |
| BLT1 | 0V | 0V |
| BLT2 | 10V | 10V |
| BLT3 | 10V | 10V |
| BLT4 | 0V | 0V |
| BLB1 | 0V | 0V |
| BLB2 | 2V | 2V |
| BLB3 | 0V | 0V |
| BLB4 | 0V | 0V |
| Substrate | 0V or −Vb | 0V or −Vb |
| Un-selected Word Line | 0V or −Vg | 0V or −Vg |

FIG.18

MEMORY APPARATUS AND METHOD THEREOF FOR OPERATING MEMORY

CROSS-REFERENCE TO RELATED APPLICATION

This application claims the priority benefit of U.S.A. provisional application Ser. No. 60/985,966, filed on Nov. 6, 2007. The entirety of the above-mentioned patent application is hereby incorporated by reference herein and made a part of this specification.

BACKGROUND OF THE INVENTION

1. Field of Invention

The present invention relates to a memory, and more specifically, to a memory apparatus and a method thereof for operating a memory.

2. Description of Related Art

Non-volatile memory is popular and used in a wide range of electronic devices. The main characteristic of non-volatile memory is that its stored information is retained even after the power supply is terminated, thus making it suitable for portable electronic products, e.g. portable storage drives, digital cameras, mobile phones, mp3 players, etc.

Please refer to FIG. 1, which is a schematic diagram showing the structure of a non-volatile memory cell 10. The non-volatile memory cell 10 has a control gate 12, a charge storage layer 14, a first source/drain region 16, a second source/drain region 18, and a substrate 20. The charge storage layer 14, which is formed between the control gate 12 and the substrate 20, is known as a floating gate.

When programming the non-volatile memory cell 10, a gate voltage $V_g$ of 8V to 10V is applied to the control gate 12 to turn on the channel between the first source/drain region 16 and the second source/drain region 18. A source voltage $V_s$ of 0V and a drain voltage $V_d$ of 4V to 5V are respectively applied to the first source/drain region 16 and the second source/drain region 18. Since the channel between the first source/drain region 16 and the second source/drain region 18 is turned on, a channel electron flow $I_{ch}$ is generated and flowing from the first source/drain region 16 to the second source/drain region 18. Some hot electrons $I_j$ of the channel electron flow $I_{ch}$ are injected into the charge storage layer 14, thus altering the threshold voltage $V_t$ of the non-volatile memory cell 10. Since the injected electrons are trapped in the charge storage layer 14, the information stored in the non-volatile memory cell 10 is preserved even if the power supply of the non-volatile memory cell 10 is terminated.

However, as the dimensions of the memory apparatus and memory cells thereof are reduced, the punch-through current between memory cells becomes more prominent, and adversely affects the stability of the non-volatile memory cells during programming.

In order to decrease the punch-through current, the inventors of the present invention propose several methods to reduce the punch-through current, one of which is to serially connect several memory cells together, such that the effective channel length of the programming cell is increased. FIG. 2 is a schematic diagram showing the structure of a non-volatile memory disclosed by the inventors. As shown in FIG. 2, the two memory cells 240, 250 on a substrate 150 are connected to each other, wherein the memory cell 240 is a programming memory cell, and the memory cell 250 is a cascaded memory cell. The two memory cells 240, 250 have source/drain regions 130, 210, and share another source/drain region 220. Moreover, the memory cells 240, 250 respectively have a charge storage layer 231 or 232, and share a control gate 110. When programming the memory cell 240, the source voltage $V_s$ is 0V, the drain voltage $V_d$ is 4V to 5V, and the shared source/drain region 220 is in a floating state. As shown in FIG. 2, $V_f$ represents the floating state voltage of the source/drain region 220. Since the effective channel length is increased, the punch-through current is decreased. This method can be used extendedly for three or more serial-connected memory cells. Please refer to FIG. 3, which is a schematic diagram showing the structure of another non-volatile memory disclosed by the inventors. Three memory cells 240, 250, and 310 are connected in serial. The source voltage $V_s$ and the drain voltage $V_d$ are respectively applied to one of the source/drain regions 130 and 210. Therefore, the effective channel length is further increased and the punch-through current further reduced.

Referring to FIG. 2, the channel electron flow $I_c$ is affected by the magnitude of the threshold voltage of the memory cell 250. In detail, if the threshold voltage of the memory cell 250 increases, the electron flow $I_c$ decreases accordingly. In other words, the electron flow $I_c$ will increase if the threshold voltage of the memory cell 250 is decreased. According to the Kirchoff's Current Law, the sum of currents flowing towards a point is equal to the sum of currents flowing away from that point. Hence, the channel electron flow $I_p$ of memory cell 240 is equal to the channel electron flow $I_c$ of memory cell 250. Therefore, the channel electron flow $I_p$ is also affected by the magnitude of the threshold voltage of the memory cell 250. Thus, the programming speed of the memory cell 240 is varied with reference to the threshold voltage of the memory cell 250. In other words, a higher threshold voltage of the memory cell 250 results in smaller channel electron flows $I_c$ and $I_p$, such that the programming speed of the memory cell 240 is slowed down; and a lower threshold voltage of the memory cell 250 results in greater channel electron flows $I_c$ and $I_p$, such that the programming speed of the memory cell 240 is increased. However, due to the dispersion of programming speed, more involved conditions should be taken into consideration when handling the operations of the memory cells. Such situation is not desired.

Please refer to FIGS. 2 and 4. FIG. 4 is diagram showing the relationships of the channel electron flows $I_p$ and $I_c$ versus the floating voltage $V_f$ of the source/drain region 220. In FIG. 4, the curve $I_cL_1$ represents the relationship of the channel electron flow $I_c$ versus the floating voltage $V_f$, and the curve $I_pL$ represents the relationship of the channel electron flow $I_p$ versus the floating voltage $V_f$. When the floating voltage $V_f$ increases, the drain-source voltage $V_{ds}$ (i.e. $V_f-V_s$) of the memory cell 250 increases, such that the channel electron flow $I_c$ increases as well. Meanwhile, the drain-source voltage $V_{ds}$ (i.e. $V_d-V_f$) and the gate-source voltage $V_{gs}$ (i.e. $V_g-V_f$) of the memory cell 240 both decrease, such that the channel electron flow $I_p$ decreases as well. Oppositely, when the floating voltage $V_f$ decreases, the drain-source voltage $V_{ds}$ of the memory cell 250 decreases, such that the channel electron flow $I_p$ decreases as well. Additionally, the gate-source voltage $V_{gs}$ and drain-source voltage $V_{ds}$ of the programming memory cell 240 increases, causing an increase of the channel electron flow $I_p$. Nevertheless, since the channel electron flows $I_c$ and $I_p$ are identical, the floating voltage $V_f$ of the source/drain region 220 should be balanced at the intersection of the curve $I_pL$ and the curve $I_cL_1$, where $V_f=V_{fa}$.

The foregoing example is used to describe the situation that the memory cell 250 has a low threshold voltage $V_t$. However, when memory cell 250 has a high threshold voltage $V_t$, the channel electron flow $I_c$ is reduced, causing the floating voltage $V_f$ of the source/drain region 220 to change. Please refer to FIG. 5, which is a diagram showing the influence of different threshold voltages $V_t$ on the floating voltage $V_f$. The two curves $I_cL_1$ and $I_cL_2$ represent the relationships of the channel electron flow $I_c$ versus the floating voltage $V_f$ when the memory cell 250 has a low threshold voltage and a high threshold voltage respectively. When the memory cell 250 has a high threshold voltage, as seen in the curve $I_cL_2$, the channel electron flow $I_c$ decreases from $I_1$ to $I_2$. Consequently, the floating voltage $V_f$ of the source/drain region 220 is shifted from $V_{fa}$ to $V_{fb}$.

It could be seen that the different threshold voltages of the memory cell 250 adversely affect the channel electron flows $I_c$ and $I_p$ and cause the dispersion of the programming speed of the memory cells.

SUMMARY OF THE INVENTION

Accordingly, an object of the present invention is to provide a method for programming the memory cells of a non-volatile memory to increase the uniformity of the programming speed of the memory cells and lower the dispersion of the programming speed.

Another object of the present invention is to provide a memory apparatus, wherein the non-volatile memory has higher uniformity in programming speed.

A further object of the present invention is to provide a controller for programming the memory cells of a non-volatile memory to increase the uniformity of the programming speed.

The present invention provides a method for operating a memory. The memory has a plurality of memory cells. Each of the memory cells has a first source/drain region shared with a neighboring memory cell and a second source/drain region. The method comprises: turning on all channels between the second source/drain region of a first memory cell of the plurality of memory cells and the second source/drain region of a second memory cell of the plurality of memory cells; applying a first voltage to the second source/drain region of the first memory cell and applying a second voltage to the second source/drain region of the second memory cell to program the first memory cell; and applying an electron flow into at least a first source/drain region between the second source/drain region of the first memory cell and the second source/drain region of the second memory cell.

The present invention also provides a memory apparatus. The memory apparatus comprising a memory, a plurality of word lines, a plurality of bit lines, and a controller. The memory has a plurality of memory cells, and each of the memory cells has a first source/drain region shared with a neighboring memory cell and a second source/drain region. The plurality of word lines and the plurality of bit lines are coupled to the plurality of memory cells. The controller applies at least following steps to program a first memory cell of the plurality of memory cells: turning on all channels between the second source/drain region of the first memory cell and the second source/drain region of a second memory cell of the plurality of memory cells via a corresponding word line of the plurality of word lines; applying a first voltage to the second source/drain region of the first memory cell via a first bit line of the plurality of bit lines, and applying a second voltage to the second source/drain region of the second memory cell via a second bit line of the plurality of bit lines to program the first memory cell; and applying an electron flow into at least a first source/drain region between the second source/drain region of the first memory cell and the second source/drain region of the second memory cell via a third bit line of the plurality of bit lines.

In an embodiment of the present invention, an electron flow in the channel of the first memory cell is greater than an electron flow in the channel of the second memory cell.

In an embodiment of the present invention, the first source/drain region, which is applied with the electron flow, is shared by the first memory cell and the second memory cell.

In an embodiment of the present invention, the first source/drain region, which is applied with the electron flow, belongs to the third memory cell of the memory, and the third memory cell is coupled to the third bit line and disposed between the first memory cell and the second memory cell.

In an embodiment of the present invention, the first source/drain region, which is applied with the electron flow, is in a floating state.

In an embodiment of the present invention, the memory apparatus further comprises a switch and at least one dummy word line. A first electrode of the switch is coupled to the dummy word line, a second electrode of the switch is coupled to the second bit line, and a third electrode of the switch is coupled to the third bit line. The step for applying the electron flow comprises: applying a third voltage to the first electrode of the switch via the dummy word line to turn on the switch; and applying the second voltage to the second electrode of the switch via the second bit line to generate the electron flow.

In an embodiment of the present invention, the switch is arranged in a row of switches, and the dummy word line is coupled to the row of the switches.

In an embodiment of the present invention, two of the switches in the row are coupled to the third bit line directly.

In an embodiment of the present invention, only one of the switches in the row is coupled to the third bit line directly.

In an embodiment of the present invention, the dummy word line is disposed above or below all of the word lines.

In an embodiment of the present invention, the dummy word line is disposed between two of the word lines.

In an embodiment of the present invention, the memory apparatus comprises at least two of the dummy word lines, one of the two dummy word lines is applied with the third voltage, and the other of the two dummy word lines is applied with a fourth voltage, which is less than the third voltage.

In an embodiment of the present invention, the step for applying the electron flow comprises: applying a third voltage to a first electrode of a first switch of the memory to turn on the first switch; and applying a fourth voltage to a second electrode of the first switch to generate the electron flow. A third electrode of the first switch is coupled to the first source/drain region, which is applied with the electron flow, via the third bit line.

In an embodiment of the present invention, the step for applying the electron flow further comprises: applying a fifth voltage to a first electrode of a second switch of the memory to turn on the second switch so as to apply the first voltage to the second source/drain region of the first memory cell; and applying a sixth voltage to a first electrode of a third switch of the memory to turn on the third switch so as to apply the second voltage to the second source/drain region of the second memory cell. The third voltage is less than both the fifth voltage and the sixth voltage.

In an embodiment of the present invention, a negative voltage is applied to a substrate, where the plurality of memory cells is formed thereon, when programming the first memory cell.

According to the present invention, an electron flow is applied into the channel of the programming memory cell through a shared source/drain region, so that even if the neighboring memory cells have high threshold voltage, the electron flow can provide supplementary electron flow to program the memory cell, thus lowering the dispersion of the program speed of the memory cells.

The present invention also retains the advantages of a low punch-through current by incorporating two or more serial-connected memory cells to enlarge the effective channel length.

In order to make the aforementioned and other objects, features and advantages of the present invention comprehensible, several preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 10 is a table indicating the voltages of the nodes of the non-volatile memory shown in FIG. 9 when the programming operations are performing.

FIG. 13 is a table indicating the voltages of the nodes of the non-volatile memory shown in FIG. 12 when the programming operations are performing.

FIG. 16 is a table indicating the voltages of the nodes of the non-volatile memory shown in FIG. 15 when the programming operations are performing.

FIG. 18 is a table indicating the voltages of the nodes of the non-volatile memory shown in FIG. 17 when the programming operations are performing.

DESCRIPTION OF EMBODIMENTS

Figure 1:
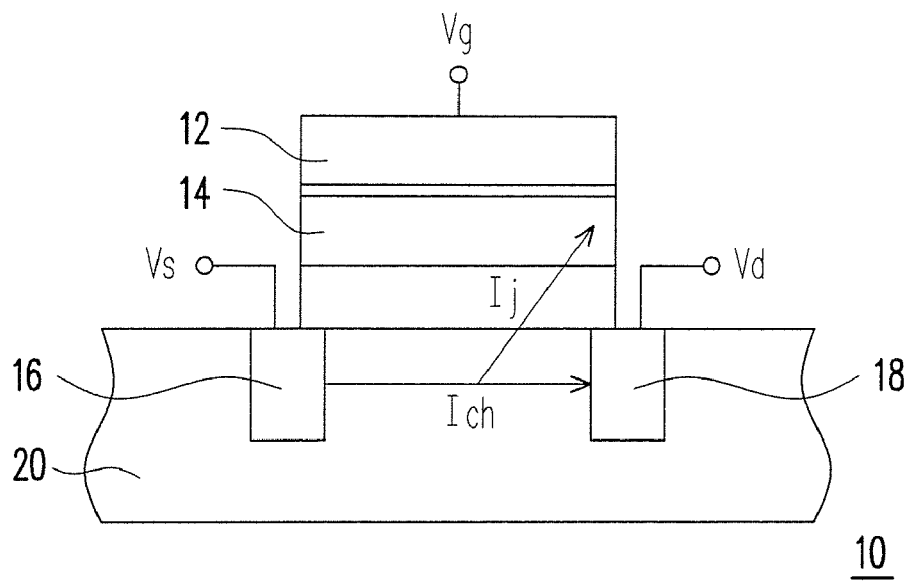
FIG. 1 is a schematic drawing showing the structure of a non-volatile memory cell.
Figure 2:
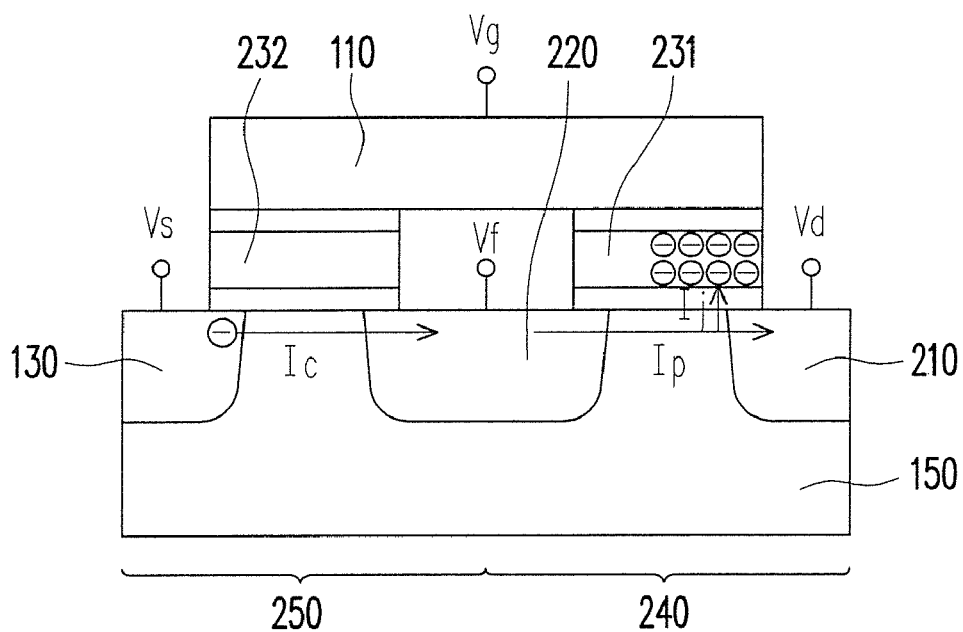
FIG. 2 is a schematic drawing showing the structure of a non-volatile memory disclosed by the inventors.
Figure 6:
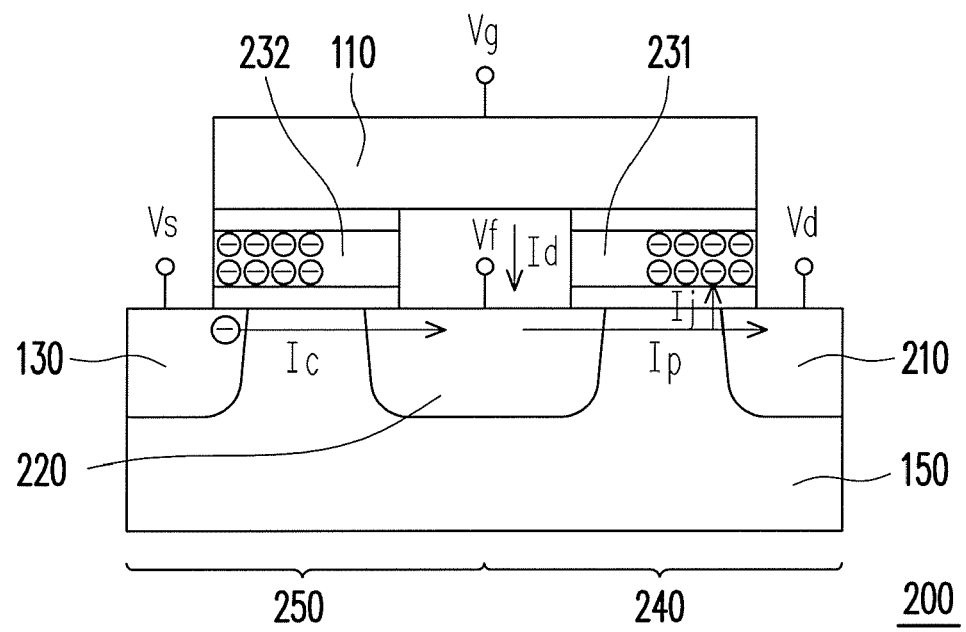
FIG. 6 is a schematic drawing showing the structure of a non-volatile memory apparatus according to an embodiment of the present invention.

In order to reduce the dispersion of the program speed of the memory cells, the present invention provides a compensation electron flow $I_d$ to supplement the channel electron flow $I_p$ of the programming memory cell 240. Please refer to FIG. 6, which is a schematic drawing showing the structure of a non-volatile memory apparatus 200 according to an embodiment of the present invention. The structure of the non-volatile memory apparatus 200 of FIG. 6 is similar to the memory apparatus shown in FIG. 2. The main difference is that there is a compensation electron flow $I_d$ applied into the shared source/drain region 220 of the memory cells 240, 250. When programming memory cell 240, a gate voltage $V_g$ of 8V to 10V is applied to the common control gate 110, and the drain voltage $V_d$ and source voltage $V_s$ are 4-5V and 0V respectively. The compensation electron flow Id is used to supplement the channel electron flow $I_p$ of the memory cell 240.

Figure 7:
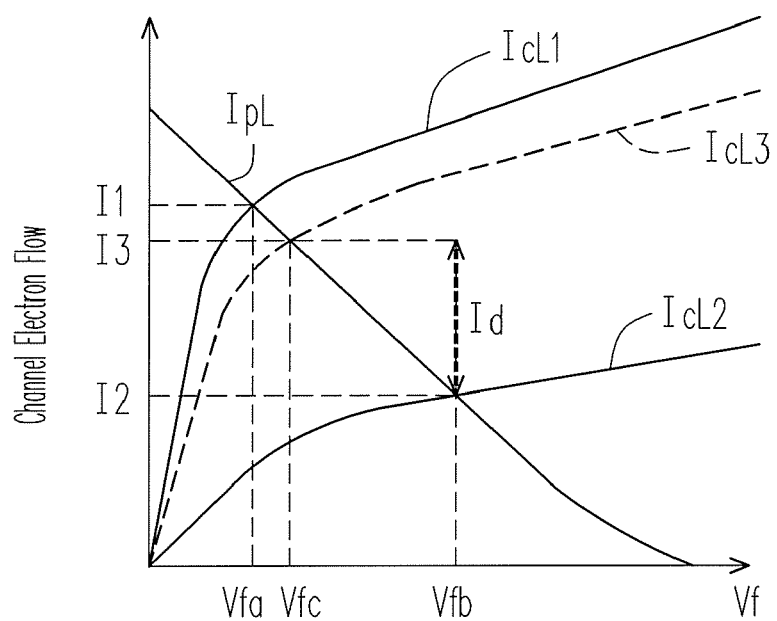
FIG. 7 is diagram showing the relationships of the channel electron flows $I_p$ and $I_c$ shown in FIG. 6 versus the floating voltage $V_f$.

The following example is used to describe the operations for programming the memory cell 240 so as to illustrate the effect of the compensation electron flow $I_d$. Please refer to FIG. 7, which is diagram showing the relationships of the channel electron flows $I_p$ and $I_c$ versus the floating voltage $V_f$. The curve $I_pL$ represents the relationship of the channel electron flow $I_p$ versus to the floating voltage $V_f$; the curve $I_cL_1$ represents the relationship of the channel electron flow $I_c$ versus to the floating voltage $V_f$ when the threshold voltage of the memory cell 250 is low; the curve $I_cL_2$ represents the relationship of the channel electron flow $I_c$ versus to the floating voltage $V_f$ when the threshold voltage of the memory cell 250 is high; and the curve $I_cL_3$ represents the relationship of an equivalent channel electron flow $I_c$ versus to the floating voltage $V_f$ when the compensation electron flow $I_d$ is provided. When the compensation electron flow $I_d$ is provided, since the channel electron flow $I_p$ of memory cell 240 is equal to $(I_d+I_c)$, the balanced floating voltage $V_f$ is equal to $V_{fc}$, i.e. the abscissa of the intersection of the curves $I_pL$ and $I_cL_3$. As shown in FIG. 7, the difference between the voltages $V_{fc}$ and $V_{fa}$ is less than the difference between the voltages $V_{fb}$ and $V_{fa}$. Therefore, even the threshold voltage of the memory cell 250 is changed, the channel electron flow $I_p$ becomes more uniform because of the presence of the compensation electron flow $I_d$, thus reducing the programming speed dispersion of the memory cells. Additionally, as shown in FIG. 7, when compensation electron flow $I_d$ is provided, the corresponding channel electron flow will be equal to $I_3$, wherein the difference between the electron flows $I_1$ and $I_3$ is less than the difference between the electron flows $I_1$ and $I_2$.

Figure 3:
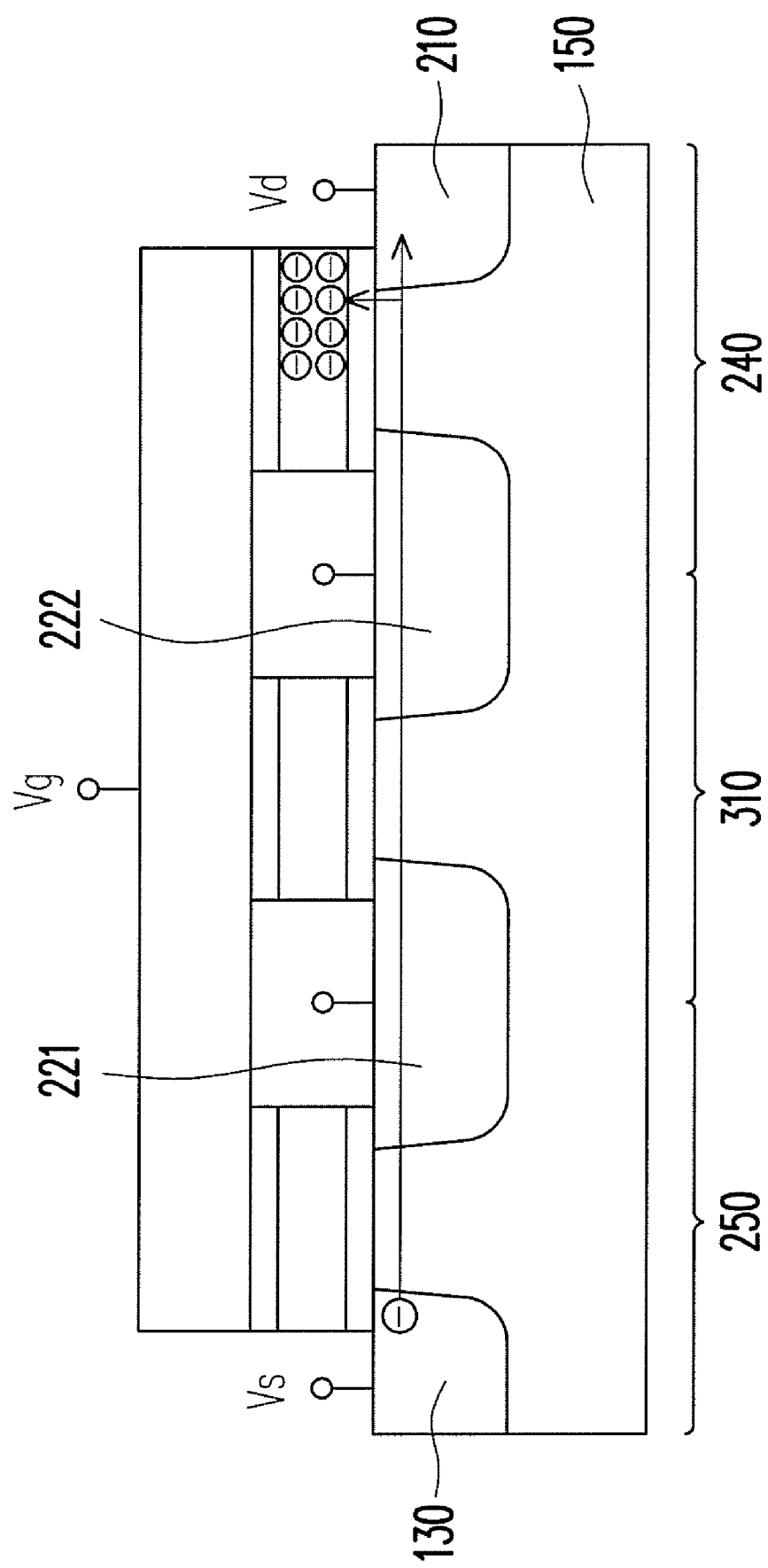
FIG. 3 is a schematic drawing showing the structure of another non-volatile memory disclosed by the inventors.
Figure 4:
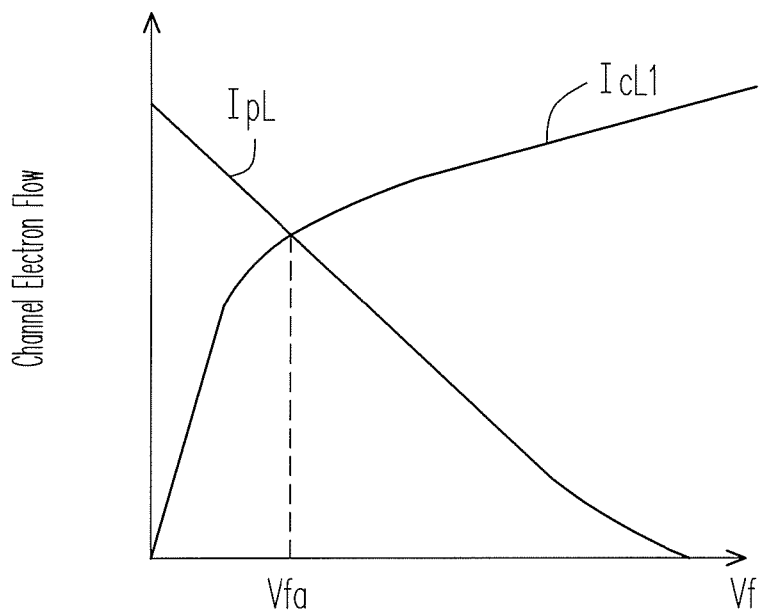
FIG. 4 is diagram showing the relationships of the channel electron flows $I_p$ and $I_c$ shown in FIG. 2 versus the floating voltage $V_f$.
Figure 5:
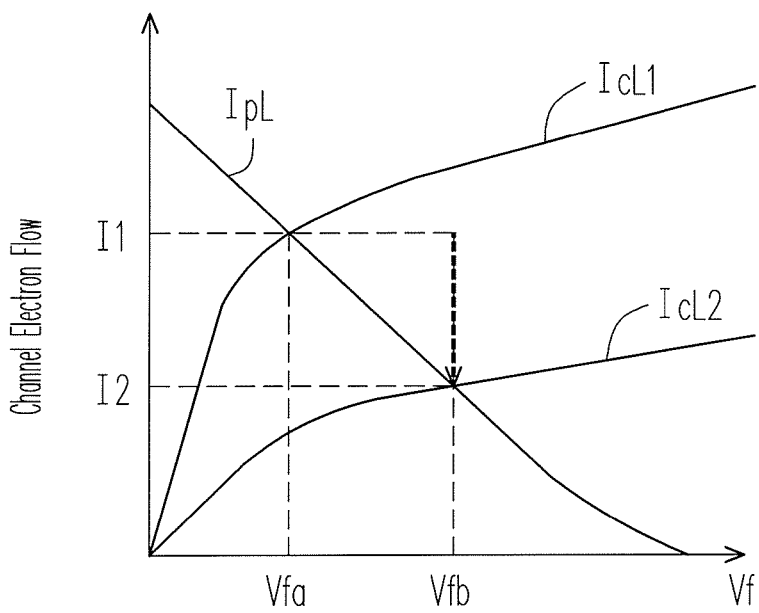
FIG. 5 is a diagram showing the influence of different threshold voltages on the floating voltage $V_f$.

In the aforementioned embodiment, two serial-connected memory cells are used to illustrate the present invention. However, the present invention is not limited thereto. Three or more serial-connected memory cells also can be used to implement the present invention. For example, the compensation electron flow $I_d$ may be applied into one of the shared source/drain regions 221 and 222 in FIG. 3 to supplement the electron flow needed to program memory cell 240 or 250. Besides, in the previously mentioned embodiment, the two memory cells 240 and 250 or the three memory cells 240, 250 and 310 share a common control gate. However, the present invention is also not limited thereto. For example, in another embodiment of the present invention, each memory cell has an independent and separated control gate.

Figure 8:
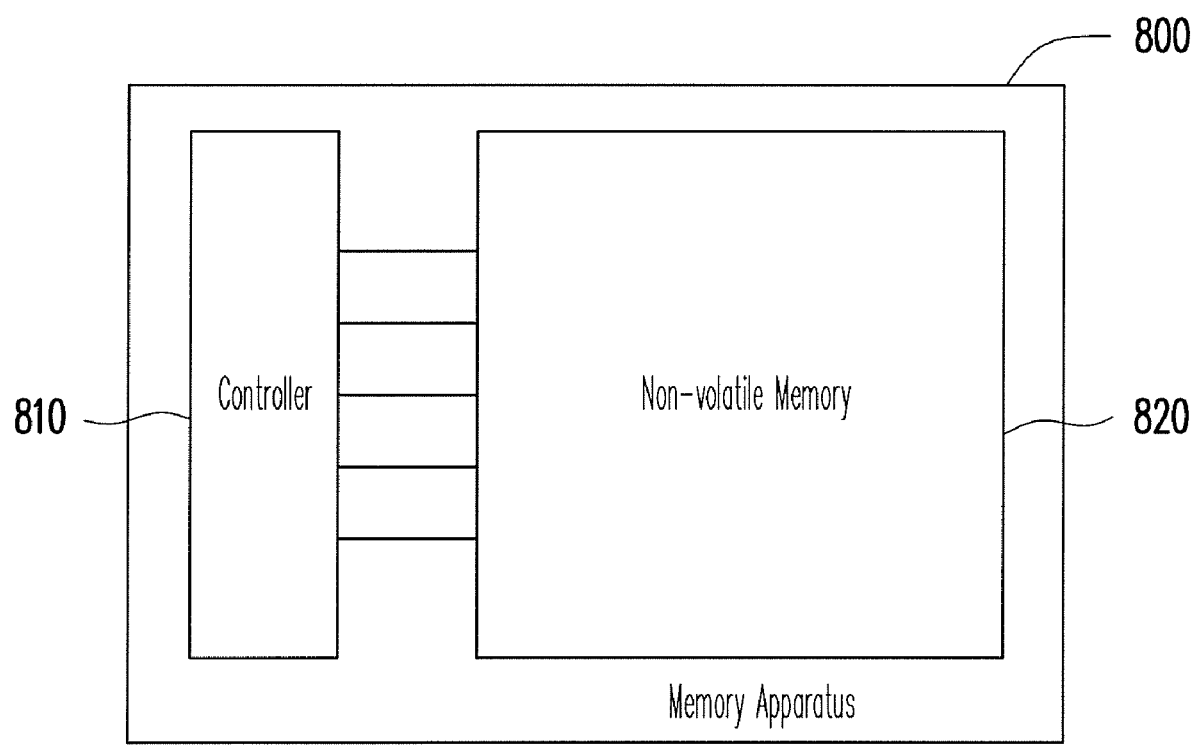
FIG. 8 is a block diagram of a memory apparatus according to the present invention.

Please refer to FIG. 8, which is a block diagram of a memory apparatus 800 according to the present invention. The memory apparatus 800 has a controller 810 and a non-volatile memory 820. The controller 810 uses the method of the present invention to program the memory cells of the non-volatile memory 820.

Figure 9:
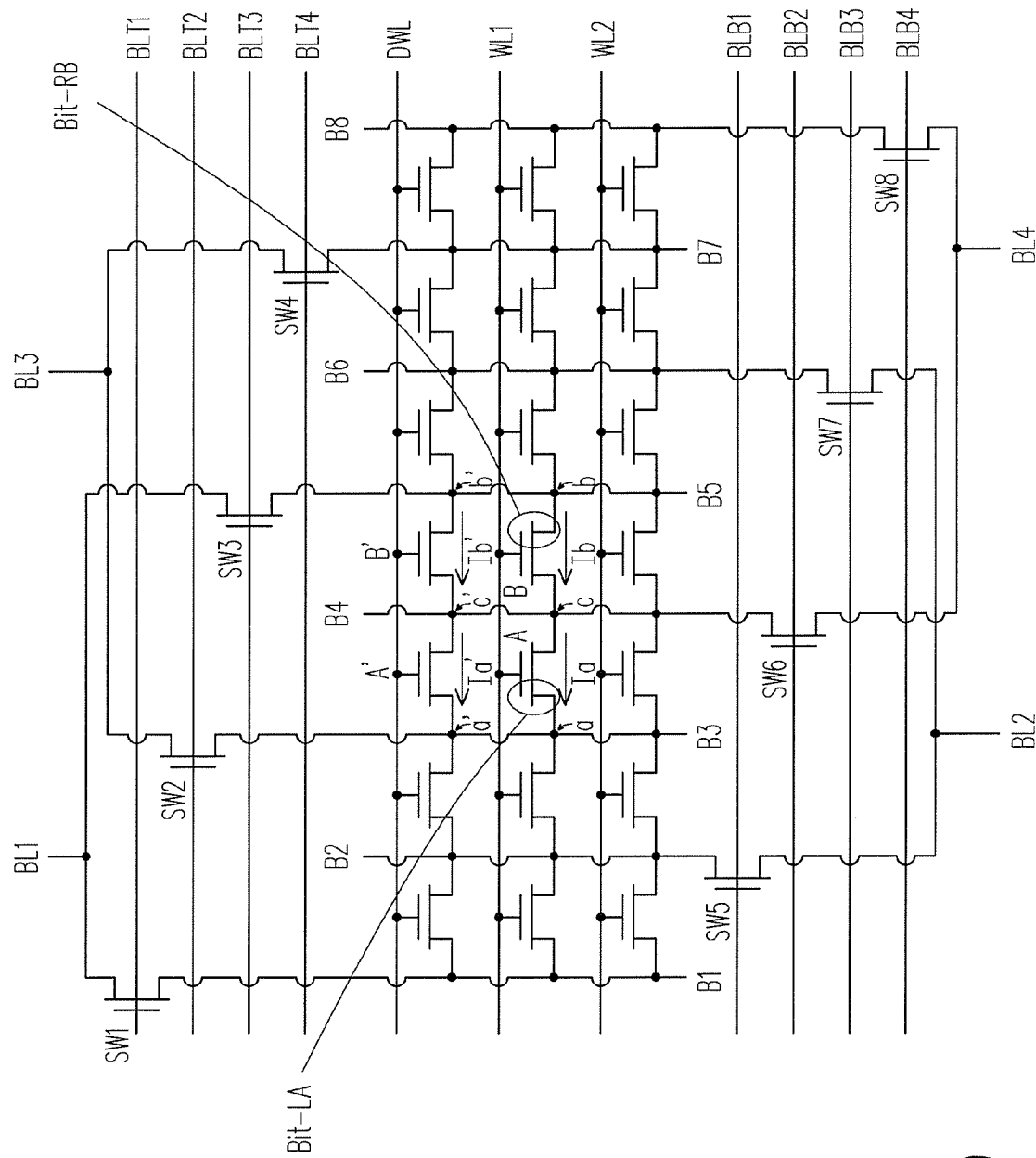
FIG. 9 is a circuit diagram of the non-volatile memory shown in FIG. 8 according to a first embodiment of the present invention.

Please refer to FIG. 9, which is a circuit diagram of the non-volatile memory 820 according to a first embodiment of the present invention. The non-volatile memory 820 has a plurality of memory cells, e.g. the memory cells A, B, A', and B'. Each of the memory cells of the non-volatile memory 820 has a first source/drain region (e.g. the source/drain region 220 shown FIG. 6) shared with a neighboring memory cell and a second source/drain region (e.g. the source/drain region 130 or 210 shown in FIG. 6). The non-volatile memory 820 further comprises a plurality of bit lines B1-B8, a plurality of word lines WL1-WL2, and at least one dummy word line DWL. The bit lines B1-B8, the word lines WL1-WL2, and the at least one dummy word line DWL are coupled to the memory cells of the non-volatile memory 820 respectively. In detail, each of the bit lines B1-B8 is coupled to a corresponding column of the memory cells of the non-volatile memory 820, and each of the word lines WL1-WL2 is coupled to a corresponding row of the memory cells of the non-volatile memory 810. The dummy word line DWL may be disposed above or below all of the word lines, or disposed between any two word lines of the non-volatile memory 820. The non-volatile memory 820 further comprises a plurality of bit transmission lines BL1-BL4 and a plurality of switches SW1-SW8. Each of the bit transmission lines BL1-BL4 is coupled to a plurality of the bit lines of the non-volatile memory 820. For example, the bit transmission line BL1 is coupled to the bit lines B1 and B5. Additionally, each of the switches SW1-SW8 is controlled by a control voltage and coupled to a bit transmission line and a bit line. For example, the switch SW3 is controlled by the control voltage BLT3 and coupled to the bit transmission line BL1 and the bit line B5. As shown in FIG. 9, the bit lines B1-B8, the switches SW1-SW8, and the bit transmission lines BL1-BL4 of the non-volatile memory 820 are disposed symmetrically. However, it should be noted that the present invention is not limited thereto. Moreover, the numbers of memory cells, bit lines, word lines, and bit transmission lines are not limited to the amount shown in FIG. 9 or any other figure in the document.

In the aforementioned embodiment, each memory cell can store two bits. As shown in FIG. 6, the memory cell 240 has a charge storage layer 231 with a left side and a right side, and each side can store one bit. However, the present invention is not limited thereto. In other embodiments of the present inventions, each memory cell can store one bit, three or more bits. Moreover, in other embodiments of the present invention, the memory cells connected with the dummy word line DWL are replaced by normal switch elements, such as NMOS transistors or PMOS transistors.

The following description is used to describe how to program the left bit Bit-LA of memory cell A according to the method of an embodiment of the present invention. Please refer to FIGS. 9 and 10. FIG. 10 is a table indicating the voltages of the nodes of the non-volatile memory 820 shown in FIG. 9 when the programming operations are performing. When programming the memory cell A, voltages are applied to corresponding nodes to generate the channel electron flows Ia, Ib, Ia' and Ib' in the channels of the memory cells A, B, A', B'. In the embodiment, since the left bit Bit-LA of the memory cell A will be programmed, an electron flow must flow from the node b to the node a; conversely, when programming the right bit Bit-RB of memory cell B, an electron flow must flow from the node a to the node b.

As shown in FIG. 9, the memory cells A and B are coupled to the word line WL1. The memory cells A' and B', which are located above the memory cells A and B, are coupled to the dummy word line DWL and arranged in a row. The left nodes of the memory cells A and A' are respectively the node a and the node a'. The nodes a and a' are coupled to the bit line B3 and to bit transmission line BL3 via the switch SW2. A control voltage BLT2 is applied to the switch SW2 so as to turn on/off the switch SW2. When control voltage BLT2 is high, the switch SW2 is turned on, and the voltage from the bit transmission line BL3 is applied to the bit line B3 through the switch SW2. The right nodes of the memory cells B and B' are respectively nodes b and b'. The nodes b and b' are coupled to the bit line B5 and to the bit transmission line BL1 via the switch SW3. A control voltage BLT3 is applied to the switch SW3 so as to turn on/off the switch SW3. When the control voltage BLT3 is high, the switch SW3 is turned on, and the voltage from the bit transmission line BL1 is applied to the bit line B5 through the switch SW3. A node c is located between the nodes a and b, and another node c' is located between the nodes a' and b'. Both the nodes c and c' are coupled to the bit line B4 and to the bit transmission line BL4 via the switch SW6. The memory cells A' and B' are coupled to the bit line B4 directly at the node c'. A control voltage BLB2 is applied to the switch SW6 so as to turn on/off the switch SW6. When the control voltage BLB2 is low, the switch SW6 is turned off, and the nodes c and c' are in a floating state. In other words, the voltages $V_c$ and $V_c'$ of the nodes c and c' are floating.

In order to program the left bit Bit-LA of the memory cell A, an electron flow must flow from right to left so as to inject hot electrons into the left side of the charge storage layer of the memory cell A. As shown in the first column of the table in FIG. 10, when programming the bit Bit-LA, the voltages applied to the bit transmission lines BL1 and BL3 are 0V and 5V respectively, and the bit transmission lines BL2 and BL4 are floating. Moreover, the control voltages BLT1, BLT2, BLT3, and BLT4 applied to the switch SW1, SW2, SW3, and SW4 are 0V, 10V, 10V, and 0V respectively, such that the switches SW2 and SW3 are turned on and the switches SW1 and SW4 are turned off. Therefore, the bit lines B3 and B5 are biased at 5V and 0V respectively. Additionally, a voltage of 10V is applied to word line WL1 to turn on all of the channels between the memory cells A and B. Since the voltage applied to the bit line B5 is higher than the voltage applied to the bit line B3, an electron flow will flow from the node b to the node a. In the meantime, an appropriate voltage is applied to dummy word line DWL so that one of the channels of the memory cells A' and B' is turned on, and the other channel is turned off or slightly turned on. For example, if the threshold voltages of memory cells A and B are 3.5V, and the voltage applied to the dummy word line DWL is 5V, the gate-source voltage $V_{gs}$ of memory cell B' is equal to the voltage difference between the dummy word line DWL and the bit line B5, i.e. 5V−0V=5V. Since $V_{gs}$ (5V) is greater than the threshold voltage (3.5V), the channel of the memory cell B' is turned on. Moreover, since the gate-source voltage $V_{gs}$ of memory cell A' is equal to the voltage difference between the dummy word line DWL and the node c', when the voltage Vc' of the node c' is greater than 1.5V, the channel of the memory cell A' is turned off, causing most of the electron flow Ib' to flow to the node c. However since the memory cell B' is turned on and the electron flow Ib' flows through the channel of the memory cell B', the voltage Vc' of the node c' is usually greater than 1.5V, hence the memory cell A' is usually turned off. Therefore, Ib' is significantly greater than Ia'. Since (Ia+Ia')=(Ib+Ib'), Ia is substantially equal to (Ib+Ib'). Thus, it could be seen that even when the memory cell B has a high threshold voltage and supplies a lower electron flow Ib, the electron flow Ib' can act as a compensation electron flow and supplement the electron flow Ia, such that the drop in the electron flow Ia is decreased.

Figure 11:
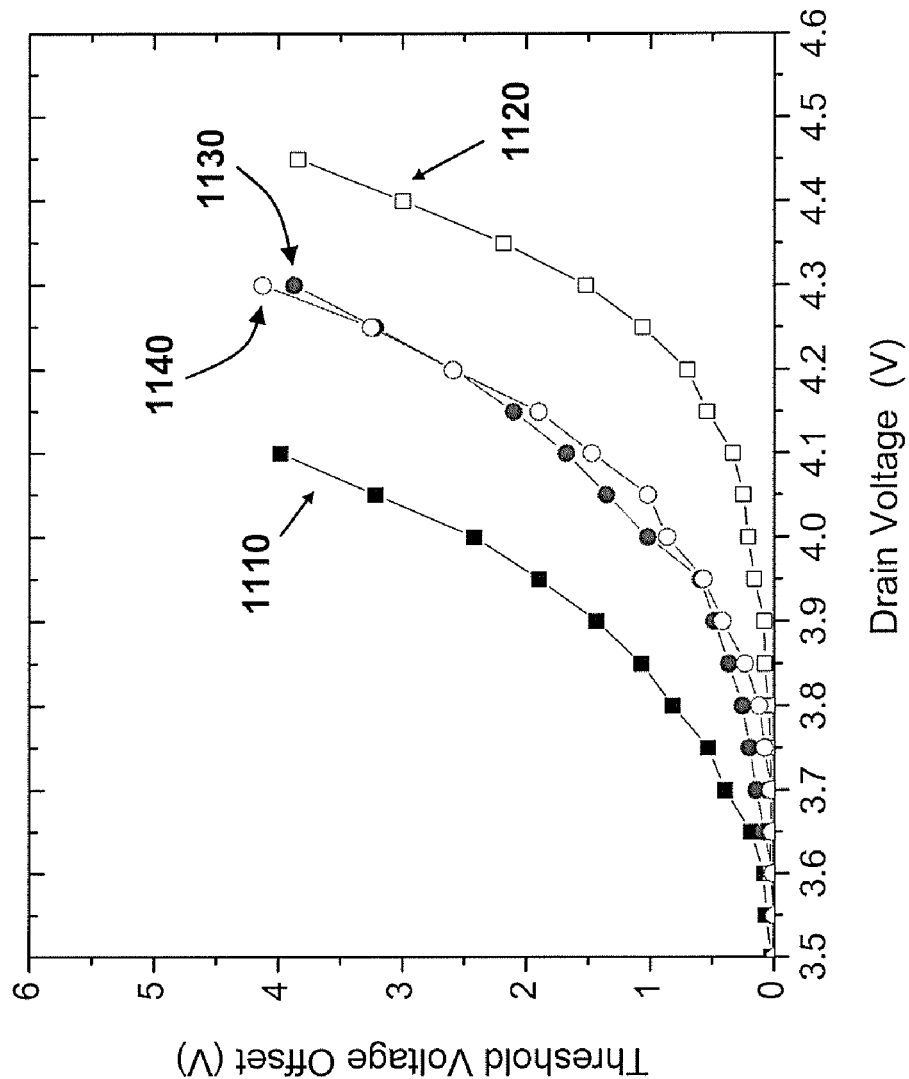
FIG. 11 is a line chart showing the relationships of the threshold voltage shift of the programming memory cell in the non-volatile memory shown in FIG. 9 versus the drain voltage applied to the programming memory cell.

Please refer to FIG. 11, which is a line chart showing the relationships of the threshold voltage shift of the programming memory cell in the non-volatile memory 820 shown in FIG. 9 versus the drain voltage applied to the programming memory cell. The horizontal axis of FIG. 11 represents the drain voltage $V_d$ applied to the programming memory cell, and the vertical axis represents the threshold voltage shift of the programming memory cell. FIG. 11 illustrates four curves 1110, 1120, 1130 and 1140. The curve 1110 represents the threshold voltage shift of the programming memory cell when a memory cell neighboring to the programming memory cell has a low threshold voltage, and there is no compensation electron flow provided. The curve 1120 represents the threshold voltage shift of the programming memory cell when a memory cell neighboring to the programming memory cell has a high threshold voltage, and there is no compensation electron flow provided. The curve 1130 represents the threshold voltage shift of the programming memory cell when a memory cell neighboring to the programming memory cell has a low threshold voltage, and there is a compensation electron flow provided. The curve 1140 represents the threshold voltage shift of the programming memory cell when a memory cell neighboring to the programming memory cell has a high threshold voltage, and there is a compensation electron flow provided. The generation of the compensation electron flow can be controlled by the voltage of dummy word line DWL. In detail, when dummy word line DWL is high, the compensation electron flow is generated and applied into the shared source/drain region; when dummy word line DWL is low, the compensation electron flow is not generated. As shown in FIG. 11, in comparison with the curves 1110 and 1120, the curves 1130 and 1140 are much closer to each other. Therefore, the compensation electron flow indeed reduces the dispersion in programming speed. In other words, the uniformity of the programming speed is increased.

Referring to the voltage table shown in FIG. 10, the voltages of unselected word lines can be 0V or a negative voltage such as $-V_g$ as well. The purpose of applying a negative voltage to the unselected word line is to further reduce the probability of punch-through current or leakage current occurring. In addition, the unselected word lines are the word lines disconnected from the programming memory cell. For example, when programming the memory cell A, the word line WL2 disconnected from the memory cell A is an unselected word line. By the way, the word line WL1 connected to memory cell A is a selected word line. The voltage applied to the substrate (150 referring to FIG. 6) can be 0V, or negative value (-Vb, e.g. -1V) to further reduce the punchthrough current or to enhance the programming speed.

Figure 12:
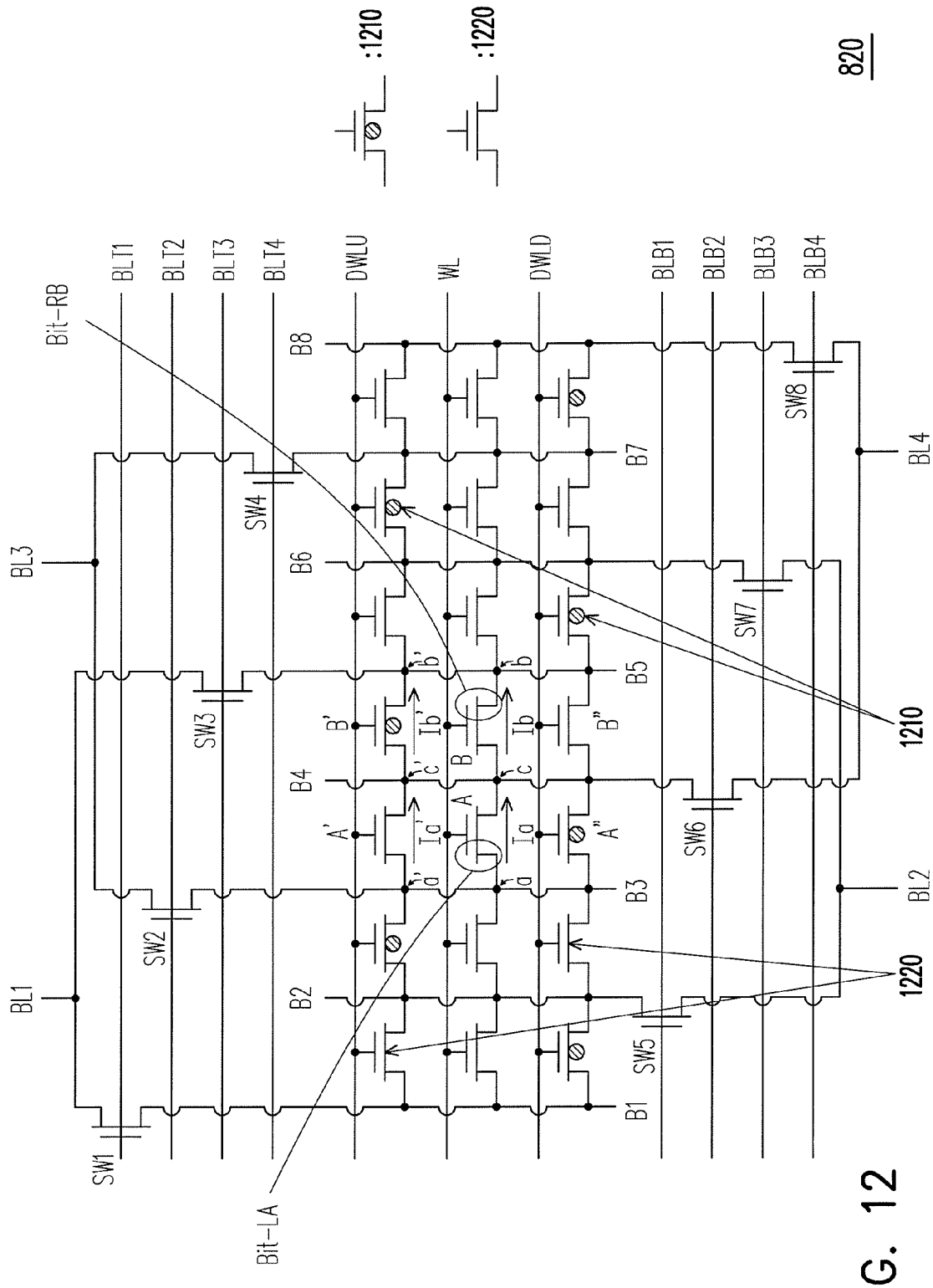
FIG. 12 is a circuit diagram of the non-volatile memory shown in FIG. 8 according to a second embodiment of the present invention.

Please refer to FIGS. 12 and 13. FIG. 12 is a circuit diagram of the non-volatile memory 820 according to a second embodiment of the present invention. FIG. 13 is a table indicating the voltages of the nodes of the non-volatile memory 820 shown in FIG. 12 when the programming operations are performing. The non-volatile memory 820 shown in FIG. 12 is similar to that shown in FIG. 9, and the main difference of the two non-volatile memories is that the non-volatile memory 820 shown in FIG. 12 has two dummy word lines DWLU and DWLD. In this embodiment, every two neighboring memory cells coupled to the dummy word lines DWLU and DWLD have different conductivities. For example, the odd memory cells on the dummy word line DWLU are high conductance memory cells 1220, and the even memory cells on the dummy word line DWLU are low conductance memory cells 1210. On the other dummy word line DWLD, the odd memory cells are low conductance memory cells 1210, and the even memory cells are high conductance memory cells 1220. In the embodiment, the conductivity of the high conductance memory cells 1220 is greater than that of the low conductance memory cells 1210. In addition, because memory cells with a higher threshold voltage have a lower conductivity, and memory cells with a lower threshold voltage have a higher conductivity, the high conductance memory cells 1220 and the low conductance memory cells 1210 can be implemented by using memory cells with different threshold voltages. For example, in this embodiment, corresponding data is written into the memory cells 1210 and 1220 beforehand, such that the conductivity of the high conductance memory cells 1220 is different from that of the low conductance memory cells 1210.

In the process of programming a memory cell, a positive voltage is applied to one of the dummy word lines DWLU and DWLD, so that the channel of one of the memory cells A' and B" is turned on, and the channel of the other memory cells A" and B' is turned off. For example, when programming the right bit Bit-RB of memory cell B, voltages of 5V and 0V are respectively applied to the dummy word lines DWLU and DWLD so as to turn on the channel of memory cell A' and turned off the channel of the memory cell B". Meanwhile, a voltage of 5V is applied to the nodes b and b' via the bit line B5, and a voltage of 0V is applied to the node a and node a' via the bit line B3, such that an electron flow flows from the node a to the node b. Moreover, since the memory cell A' is turned on and the memory cell B" is turned off, most of the electron flow Ia' will flow into the programming memory cell B to compensate the electron flow $I_b$.

Figure 14:
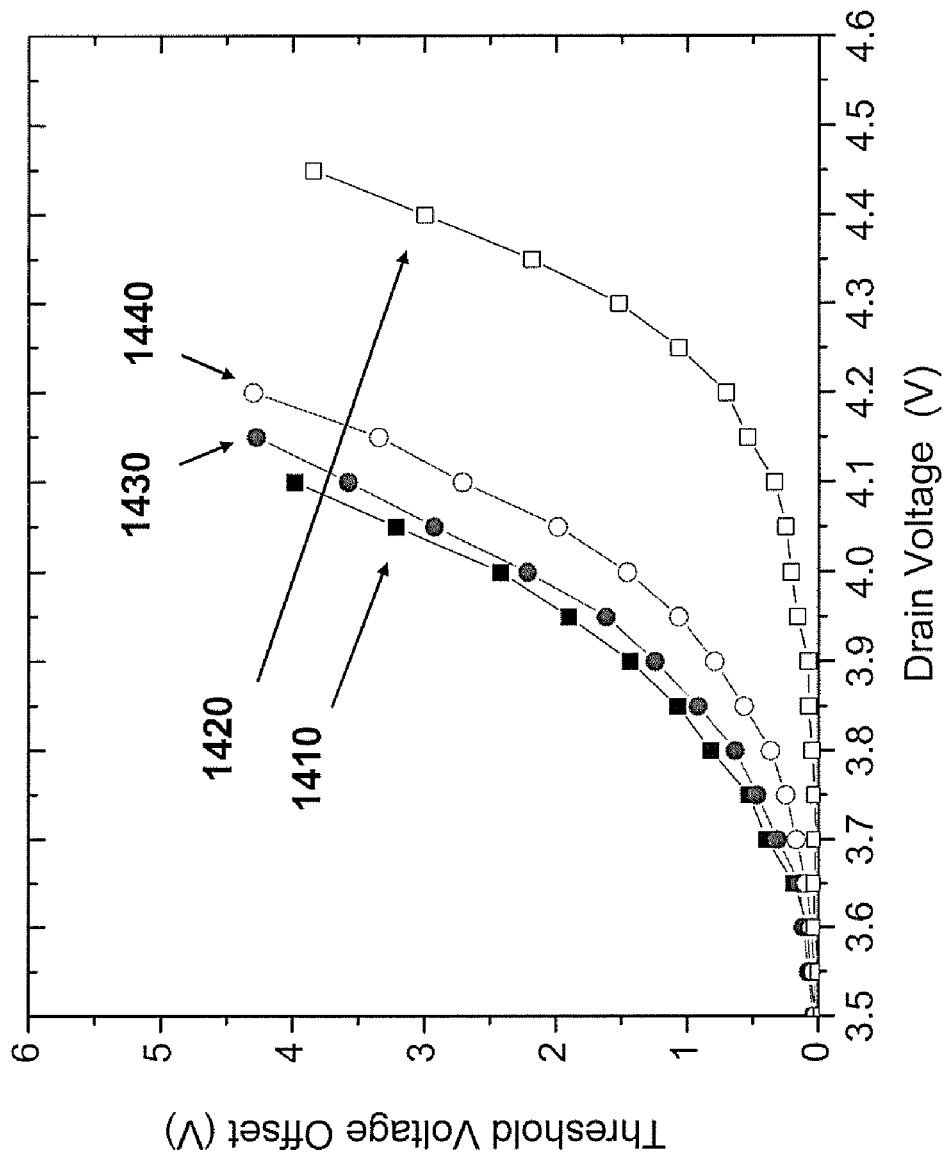
FIG. 14 is a line chart showing the relationships of the threshold voltage shift of the programming memory cell in the non-volatile memory shown in FIG. 12 versus the drain voltage applied to the programming memory cell.

Please refer to FIG. 14, which is a line chart showing the relationships of the threshold voltage shift of the programming memory cell versus the drain voltage applied to the programming memory cell. The horizontal axis of FIG. 14 represents the drain voltage $V_d$ applied to the programming memory cell, and the vertical axis represents the threshold voltage shift of the programming memory cell. FIG. 14 illustrates four curves 1410, 1420, 1430 and 1440. The curve 1410 represents the threshold voltage shift of the programming memory cell when a memory cell neighboring to the programming memory cell has a low threshold voltage, and there is no compensation electron flow provided. The curve 1420 represents the threshold voltage shift of the programming memory cell when a memory cell neighboring to the programming memory cell has a high threshold voltage, and there is no compensation electron flow provided. The curve 1430 represents the threshold voltage shift of the programming memory cell when a memory cell neighboring to the programming memory cell has a low threshold voltage, and there is a compensation electron flow provided. The curve 1440 represents the threshold voltage shift of the programming memory cell when a memory cell neighboring to the programming memory cell has a high threshold voltage, and there is a compensation electron flow provided. As shown in FIG. 14, in comparison with the curves 1410 and 1420, the curves 1430 and 1440 are much closer to each other. Therefore, the compensation electron flow indeed reduces the dispersion in programming speed of the memory cells.

Figure 15:
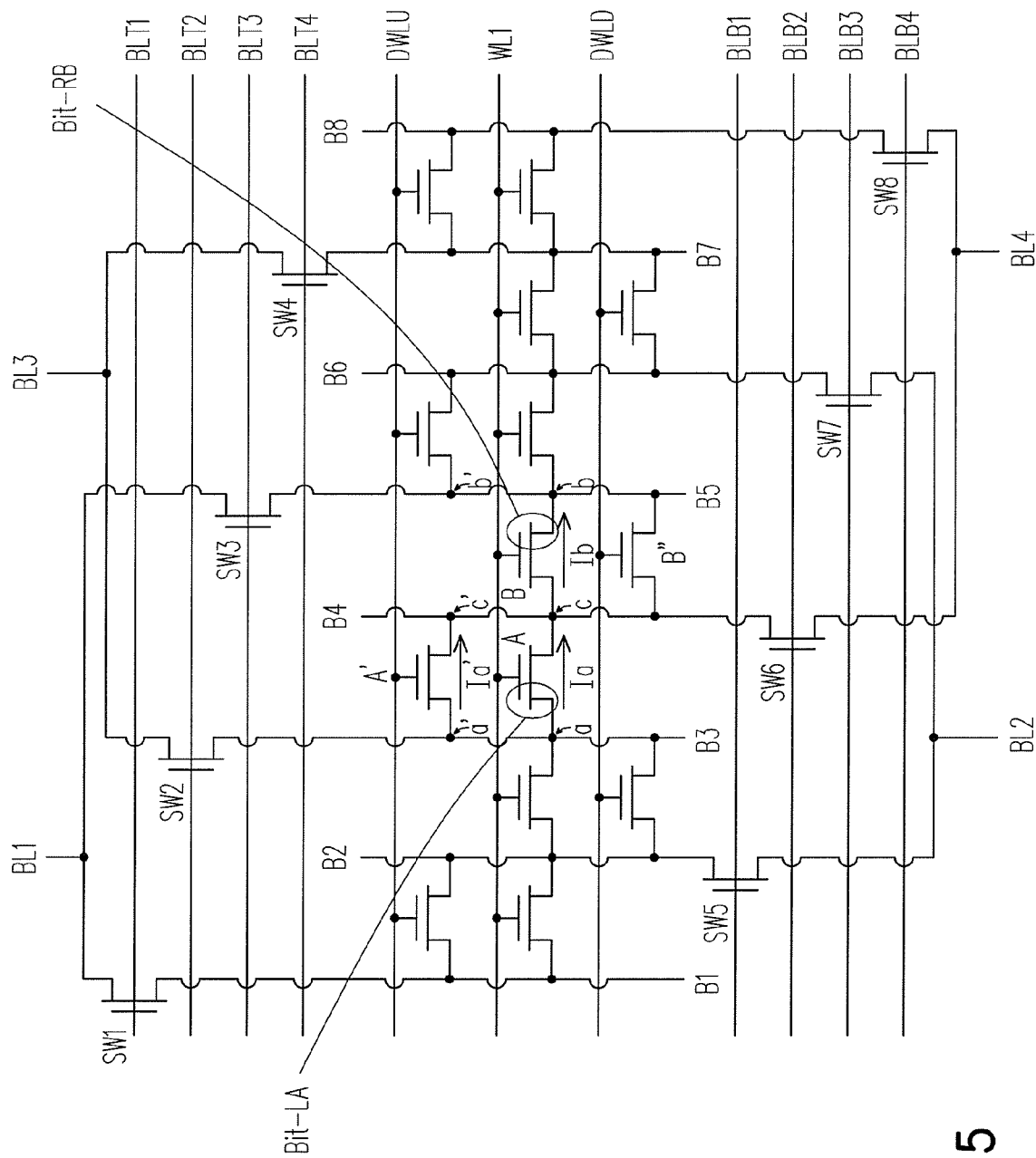
FIG. 15 is a circuit diagram of the non-volatile memory shown in FIG. 8 according to a third embodiment of the present invention.

Please refer to FIGS. 15 and 16. FIG. 15 is a circuit diagram of the non-volatile memory 820 according to a third embodiment of the present invention. FIG. 16 is a table indicating the voltages of the nodes of the non-volatile memory 820 shown in FIG. 15 when the programming operations are performing. The non-volatile memory 820 shown in FIG. 15 is similar to that shown in FIG. 12, and the main difference between the two non-volatile memories is that the low conductivity memory cells shown in FIG. 12 are replaced with open circuits in FIG. 15. In the present embodiment, the voltages of the nodes are identical with those in the second embodiment, which can be observed by comparing FIGS. 13 and 16.

Figure 17:
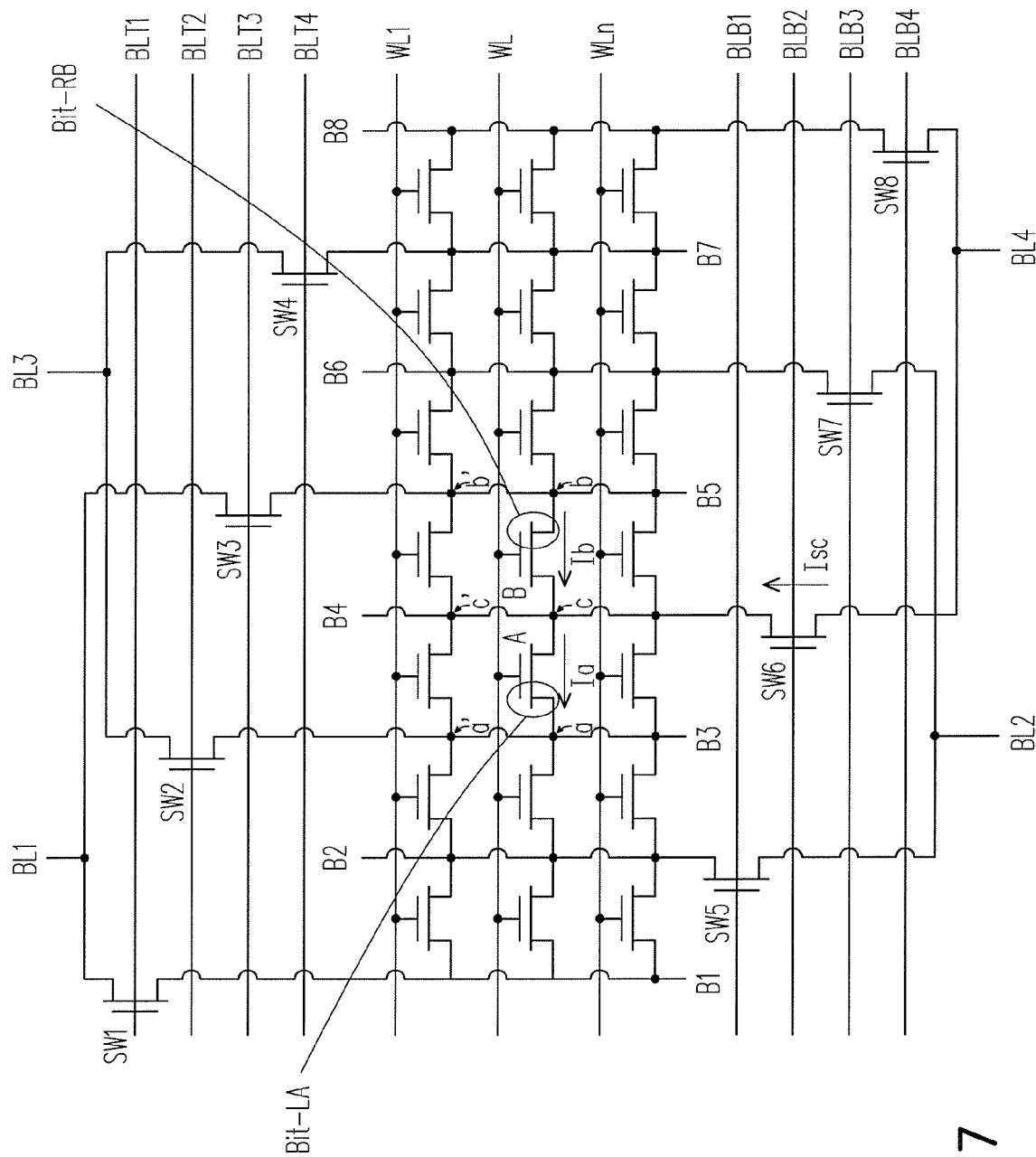
FIG. 17 is a circuit diagram of the non-volatile memory shown in FIG. 8 according to a fourth embodiment of the present invention.

Please refer to FIGS. 17 and 18. FIG. 17 is a circuit diagram of the non-volatile memory 820 according to a fourth embodiment of the present invention. FIG. 18 is a table indicating the voltages of the nodes of the non-volatile memory 820 shown in FIG. 17 when the programming operations are performing. Compared with the previous three embodiments, this embodiment does not have any dummy word line, but the compensation electron flow is also provided by using a parallel circuit. For example, when programming the left bit Bit-LA of the memory cell A, a voltage of 10V is applied to the word line WL to turn on memory cell A and B, and a voltage of 0V is applied to the rest of the word lines (e.g. the word lines WL1 and WLn). Meanwhile, a voltage of 5V is applied to the nodes a via the bit line B3. The voltage applied to the bit transmission line BL4 is 0V, and the switch SW6 is slightly turned on under the control of the control voltage BLB2, so that an electron flow $I_{sc}$ flows from the bit transmission line BL4 through the switch SW6 to the bit line B4 and the node c, and then to the memory cell A.

It should be noted that the control voltage BLB2 is 2V, which is significantly less than the 10V of the control voltage BLT2 and control voltage BLT3. Therefore, the conductivity of the switch SW6 is considerably lower than the conductivity of the switches SW2 and SW3. The voltages of the bit lines B3 and B5 are respectively substantially equal to the voltages of the bit transmission lines BL3 and BL1, i.e. 5V and 0V, due to the low resistances of the switches SW2 and SW3. Moreover, due to the high resistance of the slightly turned-on switch SW6, the voltage of the bit line B4 is different from the voltage of the bit transmission line BL4. Since the voltage of the bit transmission line BL4 is 0V, the voltage of the bit line B4 is greater than the voltage of the bit transmission line BL4, but less than the voltage of the bit transmission line BL3. In other word, the voltage of the node c of the bit line B4 is greater than 0V and less than 5V, causing the electron flow $I_{sc}$ to flow from the bit transmission line BL4 through the switch SW6, the bit line B4, and the node c to the memory cell A.

Figure 19:
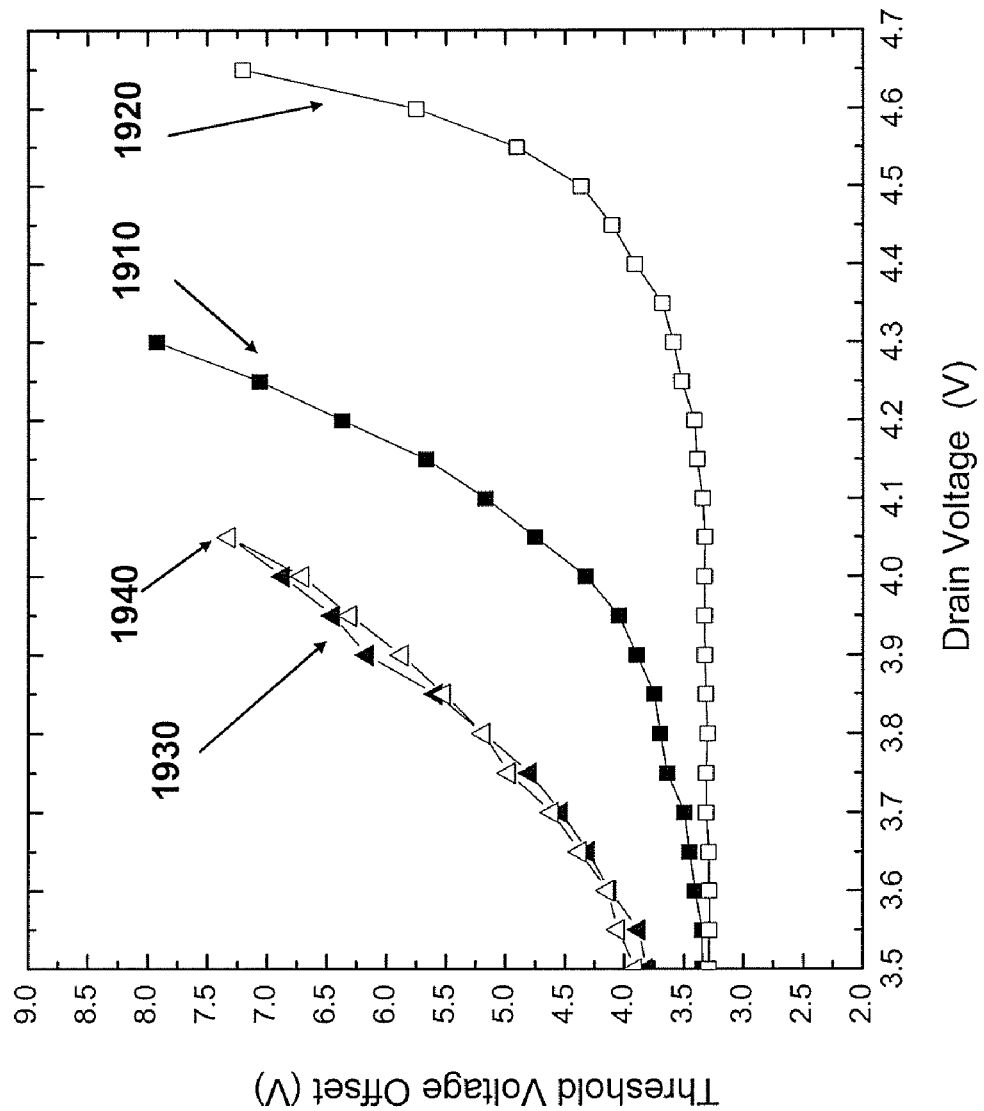
FIG. 19 is a line chart showing the relationships of the threshold voltage shift of the programming memory cell in the non-volatile memory shown in FIG. 17 versus the drain voltage applied to the programming memory cell.

Please refer to FIG. 19, which is a line chart showing the relationships of the threshold voltage shift of the programming cell versus the drain voltage applied to the programming cell. FIG. 19 illustrates four curves 1910, 1920, 1930, and 1940. The curve 1910 represents the threshold voltage shift of the programming memory cell when a memory cell neighboring to the programming memory cell has a low threshold voltage, and the control voltage BLB2 is 0V. The curve 1920 represents the threshold voltage shift of the programming memory cell when a memory cell neighboring to the programming memory cell has a high threshold voltage, and the control voltage BLB2 is 0V. The curve 1930 represents the threshold voltage shift of the programming memory cell when a memory cell neighboring to the programming memory cell has a low threshold voltage, and the control voltage BLB2 is 2V. The curve 1940 represents the threshold voltage shift of the programming memory cell when a memory cell neighboring to the programming memory cell has a high threshold voltage, and the control voltage BLB2 is 2V. When BLB2 is 0V, there is no compensation electron flow. However, when control voltage BLB2 is biased properly, e.g. at 2V, a compensation electron flow is generated. As shown in FIG. 19, in comparison with curves 1910 and 1920, the curves 1930 and 1940 are much closer to each other. Therefore, the compensation electron flow indeed reduces the dispersion in programming speed.

In conclusion, a compensation electron flow is applied into a shared source/drain region of the programming memory cell according to the present invention, so that even when a memory cell neighboring to the programming memory cell has a high threshold voltage and is unable to provide sufficient electron flow, the compensation electron flow can supplement the electron flow needed for programming the programming memory cell. Therefore, the dispersion in programming speed of the memory cells is reduced. In addition, the present invention retains the advantages of a low punch-through current by incorporating two or more serial-connected memory cells to enlarge the effective channel length.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for operating a memory, the memory having a plurality of memory cells, and each of the memory cells having a first source/drain region shared with a neighboring memory cell and a second source/drain region, the method comprising:
    turning on all channels between the second source/drain region of a first memory cell of the plurality of memory cells and the second source/drain region of a second memory cell of the plurality of memory cells;
    applying a first voltage to the second source/drain region of the first memory cell and applying a second voltage to the second source/drain region of the second memory cell to program the first memory cell; and
    applying an electron flow into at least a first source/drain region between the second source/drain region of the first memory cell and the second source/drain region of the second memory cell;
    wherein an electron flow in the channel of the first memory cell is greater than an electron flow in the channel of the second memory cell.

2. The method as claimed in claim 1, wherein the first source/drain region, which is applied with the electron flow, is shared by the first memory cell and the second memory cell.

3. The method as claimed in claim 1, wherein the first source/drain region, which is applied with the electron flow, belongs to a third memory cell of the plurality of memory cells, wherein the third memory cell is disposed between the first memory cell and the second memory cell.

4. The method as claimed in claim 1, wherein the first source/drain region, which is applied with the electron flow, is in a floating state.

5. The method as claimed in claim 1, wherein applying the electron flow comprises:
    applying a third voltage to a first electrode of a switch of the memory to turn on the switch; and
    applying the second voltage to a second electrode of the switch to generate the electron flow;

wherein the second electrode of the switch is coupled to the second source/drain region of the second memory cell via a first bit line, a third electrode of the switch is coupled to the first source/drain region of the second memory cell via a second bit line, and the electron flow is applied into the first source/drain region between the first memory cell and the second memory cell via the second bit line.

6. The method as claimed in claim 1, wherein applying the electron flow comprises:
applying a third voltage to a first electrode of a first switch of the memory to turn on the first switch; and
applying a fourth voltage to a second electrode of the first switch to generate the electron flow;
wherein a third electrode of the first switch is coupled to the first source/drain region, which is applied with the electron flow, via a bit line.

7. The method as claimed in claim 6, wherein applying the electron flow further comprises:
applying a fifth voltage to a first electrode of a second switch of the memory to turn on the second switch so as to apply the first voltage to the second source/drain region of the first memory cell; and
applying a sixth voltage to a first electrode of a third switch of the memory to turn on the third switch so as to apply the second voltage to the second source/drain region of the second memory cell;
wherein the third voltage is less than both the fifth voltage and the sixth voltage.

8. The method as claimed in claim 1, wherein the method further comprises:
applying a negative voltage on a substrate, where the plurality of memory cells is formed thereon, when programming the first memory cell.

9. A memory apparatus comprising:
a memory having a plurality of memory cells, each of the memory cells having a first source/drain region shared with a neighboring memory cell and a second source/drain region;
a plurality of word lines coupled to the plurality of memory cells;
a plurality of bit lines coupled to the plurality of memory cells; and
a controller, wherein the controller turns on all channels between the second source/drain region of a first memory cell of the plurality of memory cells and the second source/drain region of a second memory cell of the plurality of memory cells via a corresponding word line of the plurality of word lines, applies a first voltage to the second source/drain region of the first memory cell via a first bit line of the plurality of bit lines, applies a second voltage to the second source/drain region of the second memory cell via a second bit line of the plurality of bit lines, and applies an electron flow into at least a first source/drain region between the second source/drain region of the first memory cell and the second source/drain region of the second memory cell via a third bit line of the plurality of bit lines, such that the first memory cell is programmed, wherein an electron flow in the channel of the first memory cell is greater than an electron flow in the channel of the second memory cell.

10. The memory apparatus as claimed in claim 9, wherein the first source/drain region, which is applied with the electron flow, is shared by the first memory cell and the second memory cell.

11. The memory apparatus as claimed in claim 9, wherein the first source/drain region, which is applied with the electron flow, belongs to a third memory cell of the memory, wherein the third memory cell is coupled to the third bit line and disposed between the first memory cell and the second memory cell.

12. The memory apparatus as claimed in claim 9, wherein the first source/drain region, which is applied with the electron flow, is in a floating state.

13. The memory apparatus as claimed in claim 9, further comprising a switch and at least one dummy word line, wherein a first electrode of the switch is coupled to the dummy word line, a second electrode of the switch is coupled to the second bit line, and a third electrode of the switch is coupled to the third bit line, and the controller applies a third voltage to the first electrode of the switch via the dummy word line to turn on the switch and applies the second voltage to the second electrode of the switch via the second bit line to generate the electron flow so as to apply the electron flow.

14. The memory apparatus as claimed in claim 13, wherein the switch is arranged in a row of switches, and the dummy word line is coupled to the row of the switches.

15. The memory apparatus as claimed in claim 14, wherein two of the switches in the row are coupled to the third bit line directly.

16. The memory apparatus as claimed in claim 14, wherein only one of the switches in the row is coupled to the third bit line directly.

17. The memory apparatus as claimed in claim 13, wherein the dummy word line is disposed above or below all of the word lines.

18. The memory apparatus as claimed in claim 13, wherein the dummy word line is disposed between two of the word lines.

19. The memory apparatus as claimed in claim 13, wherein the memory apparatus comprises at least two of the dummy word lines, one of the two dummy word lines is applied with the third voltage, and the other of the two dummy word lines is applied with a fourth voltage, which is less than the third voltage.

20. The memory apparatus as claimed in claim 9, wherein the controller applies a third voltage to a first electrode of a first switch of the memory to turn on the first switch and applying applies a fourth voltage to a second electrode of the first switch to generate the electron flow so as to apply the electron flow;
wherein a third electrode of the first switch is coupled to the first source/drain region, which is applied with the electron flow, via the third bit line.

21. The method as claimed in claim 20, wherein the controller applies a fifth voltage to a first electrode of a second switch of the memory to turn on the second switch so as to apply the first voltage to the second source/drain region of the first memory cell and the controller applies a sixth voltage to a first electrode of a third switch of the memory to turn on the third switch so as to apply the second voltage to the second source/drain region of the second memory cell;
wherein the third voltage is less than both the fifth voltage and the sixth voltage.

22. The method as claimed in claim 9, wherein the controller further applies a negative voltage on a substrate, where the plurality of memory cells is formed thereon, when programming the first memory cell.

* * * * *